(12) United States Patent
Zhou et al.

(10) Patent No.: US 11,320,208 B2
(45) Date of Patent: May 3, 2022

(54) HEIGHT-ADJUSTABLE HEAT DISSIPATION UNIT

(71) Applicant: ASIA VITAL COMPONENTS (CHINA) CO., LTD., Shenzhen (CN)

(72) Inventors: Xiao-Xiang Zhou, Shenzhen (CN); Han-Min Liu, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 0 days.

(21) Appl. No.: 16/283,827

(22) Filed: Feb. 25, 2019

(65) Prior Publication Data

US 2020/0271391 A1 Aug. 27, 2020

(51) Int. Cl.
| | | |
|---|---|---|
| *F28D 15/00* | (2006.01) | |
| *F28D 15/02* | (2006.01) | |
| *F28D 15/04* | (2006.01) | |
| *F28F 21/00* | (2006.01) | |

(52) U.S. Cl.
CPC ..... *F28D 15/0241* (2013.01); *F28D 15/0233* (2013.01); *F28D 15/04* (2013.01); *F28D 2015/0216* (2013.01); *F28F 21/00* (2013.01); *F28F 2255/02* (2013.01)

(58) Field of Classification Search
CPC .... F28F 2255/02; F28F 21/084; F28F 21/085; F28F 21/00; F28D 15/02; F28D 15/0241; F28D 15/0233; F28D 2015/0216; H01L 23/427
See application file for complete search history.

(56) References Cited

U.S. PATENT DOCUMENTS

| | | | | |
|---|---|---|---|---|
| 3,604,504 A | * | 9/1971 | Kessler, Jr. ........... | F28D 15/046 165/46 |
| 5,694,295 A | * | 12/1997 | Mochizuki ......... | F28D 15/0233 361/699 |
| 2010/0263835 A1 | * | 10/2010 | Wang ..................... | F28D 15/04 165/104.26 |

FOREIGN PATENT DOCUMENTS

| | | | |
|---|---|---|---|
| CN | 101666586 A | | 3/2010 |
| CN | 201522215 U | | 7/2010 |
| JP | 1984060184 A | * | 4/1984 |
| TW | I563370 B | | 12/2016 |
| TW | M577967 U | | 5/2019 |

OTHER PUBLICATIONS

Search Report dated May 27, 2019 issued by Taiwan Intellectual Property Office for counterpart application No. 108100538.

* cited by examiner

*Primary Examiner* — Harry E Arant
(74) *Attorney, Agent, or Firm* — Demian K. Jackson; Jackson IPG PLLC

(57) ABSTRACT

A height-adjustable heat dissipation unit includes a main body, which has a top plate member, a bottom plate member, an extendable structure and a chamber. The extendable structure is a tapered structure located between and connected to the top and the bottom plate member, and consists of one or more folding sections. The chamber is provided on inner wall surfaces with a main body wick structure and is filled with a working fluid.

11 Claims, 9 Drawing Sheets

HEIGHT-ADJUSTABLE HEAT DISSIPATION UNIT

FIELD OF THE INVENTION

The present invention relates to a heat dissipation unit, and more particularly, to a heat dissipation unit having a main body that is flexible and bendable to change its overall height.

BACKGROUND OF THE INVENTION

Following the progress in the semi-conductor technologies, the currently available integrated circuits (ICs) can have a largely reduced volume. Meanwhile, for the purpose to process more data, the number of computing elements included in the current integrated circuit design is actually several times as high as that was included in the past integrated circuit design of similar volume. However, while the integrated circuit including more computing elements has constantly increased working efficiency, the increasing computing elements thereof also produce more heat during operation thereof. For example, the heat produced by a central processing unit (CPU) at its full load capacity is high enough to burn out the entire CPU, if the produced heat is not timely removed from the CPU. Therefore, heat dissipation structures for the integrated circuits have become important issues in the electronic industrial field.

The CPU and many different kinds of chips and electronic elements are heat sources in electronic devices. When an electronic device operates, the heat sources therein will produce heat, which must be timely removed. Presently, heat pipes, vapor chambers and flat heat pipes are some of the heat dissipation structures that are frequently used to carry heat away from the heat sources or lower the temperature of the heat-producing electronic elements. The heat pipe is mainly used to transfer heat to a distant location from the heat source. For this purpose, the heat pipe has an end absorbs heat, so that a working fluid in the heat pipe is heated and changed from liquid phase into vapor phase to flow and accordingly carry heat to the other end of the heat pipe farther away from the heat source. On the other hand, the vapor chamber is mainly used to dissipate heat from a heat source having a relatively large area. For this purpose, the vapor chamber has one flat side in contact with the large-area heat source to absorb heat. The absorbed heat is then transferred to an opposite side of the vapor chamber and dissipated into ambient air while a working fluid in the vapor chamber is condensed near the opposite side.

Conventionally, the finished products of heat pipes or vapor chambers have predetermined sizes. However, the heat sources in different electronic devices are not always the same in location and in height, and every type of electronic device must use heat pipes or vapor chambers matching its heat sources. That is, not all the heat pipes or vapor chambers are universal to electronic devices of different types and sizes. Therefore, the conventional heat pipes and vapor chambers are inconvenient for use.

SUMMARY OF THE INVENTION

A primary object of the present invention is to provide a heat dissipation unit having a main body that is flexible and bendable to thereby have an adjustable overall height.

Another object of the present invention is to provide a height-adjustable heat dissipation unit that has a main body including an extendable structure, and is therefore universal to electronic devices of different types and sizes to provide changeful usages.

A further object of the present invention is to provide a height-adjustable heat dissipation unit that is highly convenient for use.

To achieve the above and other objects, the height-adjustable heat dissipation unit according to the present invention has a main body, which includes a top plate member, a bottom plate member, an extendable structure, and a chamber defined in between the top plate member, the extendable structure and the bottom plate member. The extendable structure is a tapered structure located between the top and the bottom plate member, and consists of one or more folding sections. The chamber is internally provided with a main body wick structure and filled with a working fluid. More specifically, the main body wick structure is provided on inner wall surfaces of the chamber.

With the above arrangements, the heat dissipation unit of the present invention is well flexible and bendable to enable effective change of its overall height or length, making the heat dissipation unit universal to electronic devices of different types and sizes and capable of providing changeful usages and excellent convenience in use.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
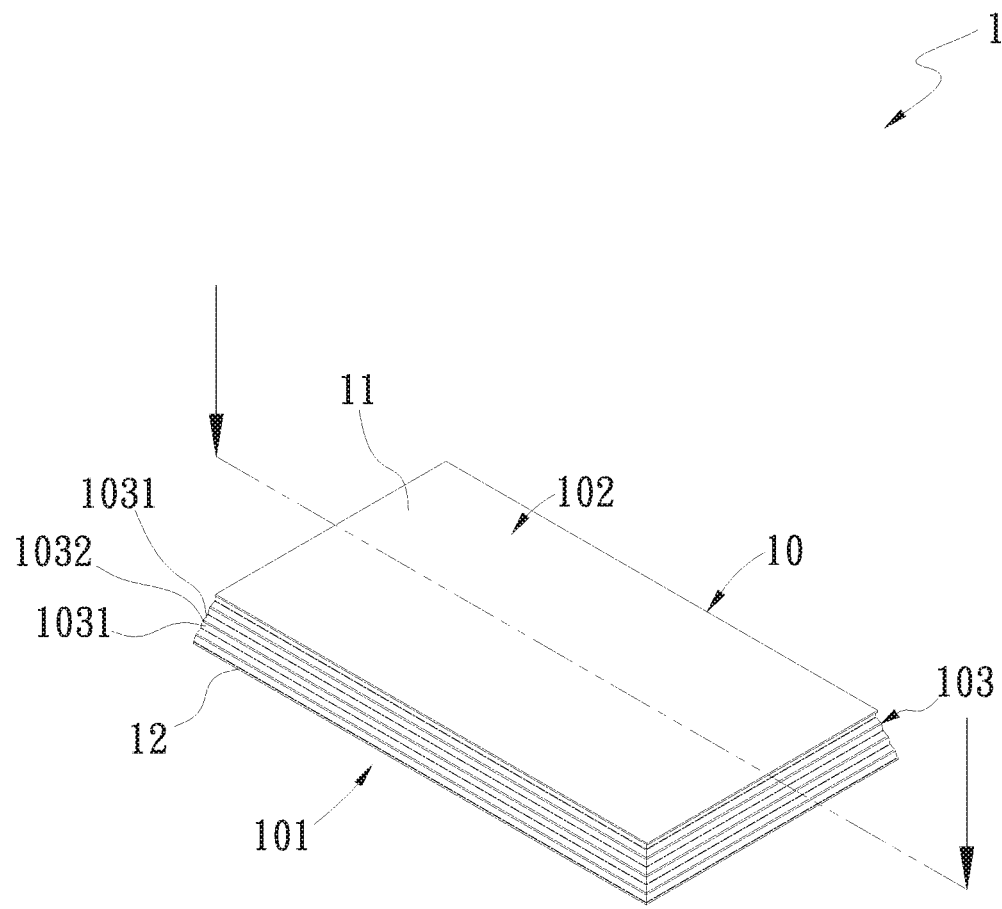
FIG. 1 is an assembled perspective view of a height-adjustable heat dissipation unit according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 1A:
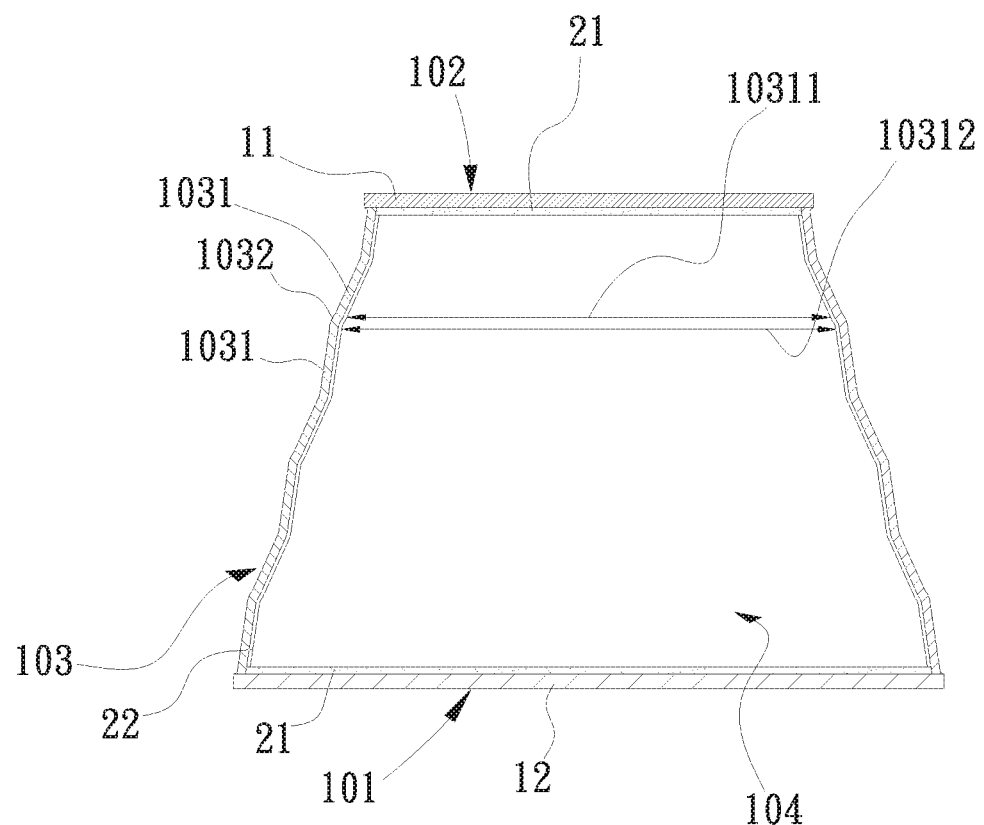
FIG. 1A is a sectional view showing the height-adjustable heat dissipation unit of FIG. 1 is in an extended state having an increased height.

Please refer to FIGS. 1 and 1A, which are assembled perspective and sectional views, respectively, of a height-adjustable heat dissipation unit 1 according to a first embodiment of the present invention. As shown, the height-adjustable heat dissipation unit 1 in the first embodiment includes a main body 10, which is non-restrictively illustrated as a vapor chamber in this embodiment. In practical implementation of the present invention, the main body 10 can be otherwise a heat spreader, a heat pipe or any other two-phase flow heat dissipation structure. The main body 10 includes a top plate member 11, a bottom plate member 12, a vaporizing section 101, a condensing section 102, an extendable structure 103, and a chamber 104. The top and the bottom plate member 11, 12 can be made of a metal material or a ceramic material. In the case of forming the top and bottom plate members 11, 12 using a metal material, the metal material can be gold, silver, copper, iron, aluminum, stainless steel, titanium, or any alloy thereof. The vaporizing section 101 and the condensing section 102 are located at the bottom plate member 12 and the top plate member 11, respectively. The vaporizing section 101 is in contact with a heat-producing element, such as a central processing unit (CPU), a display processor, a southbridge chip, a northbridge chip, or any other heat source (not shown). The extendable structure 103 can be made of a soft and flexible elastic material, such as a metal material or a plastic material. In the case of a metal material, it can be copper, gold, aluminum or any alloy thereof. In the first embodiment, the extendable structure 103 is illustrated as an upward tapered structure located between the top and the bottom plate member 11, 12 of the main body 10, or between the condensing section 102 and the vaporizing section 101. In other words, the upward tapered extendable structure 103 is extended around and between the top and the bottom plate member 11, 12 of the main body 10. More specifically, the extendable structure 103 is integrally connected at a lower and an upper end to a peripheral edge of an inner surface of the bottom plate member 12 and a peripheral edge of an inner surface of the top plate member 11, respectively, such that it is extended while upward tapered from the bottom plate member 12 to the top plate member 11. In an operable embodiment, the extendable structure 103 can be connected to the top and the bottom plate member 11, 12 by welding or diffusion bonding. In the case of welding, it can be laser welding, micro arc welding, resistance welding or spot welding.

In another operable embodiment, the top and the bottom plate member 11, 12 of the main body 10 are made of a metal material, such as copper, gold, or aluminum; and the extendable structure 103 is made of a non-metal material, such as a soft and flexible plastic, rubber, or polymeric material with good ductility and malleability. In this case, the main body 10 is integrally formed of the extendable structure 103, the top plate member 11, and the bottom plate member 12 by way of overmolding.

Figure 1B:
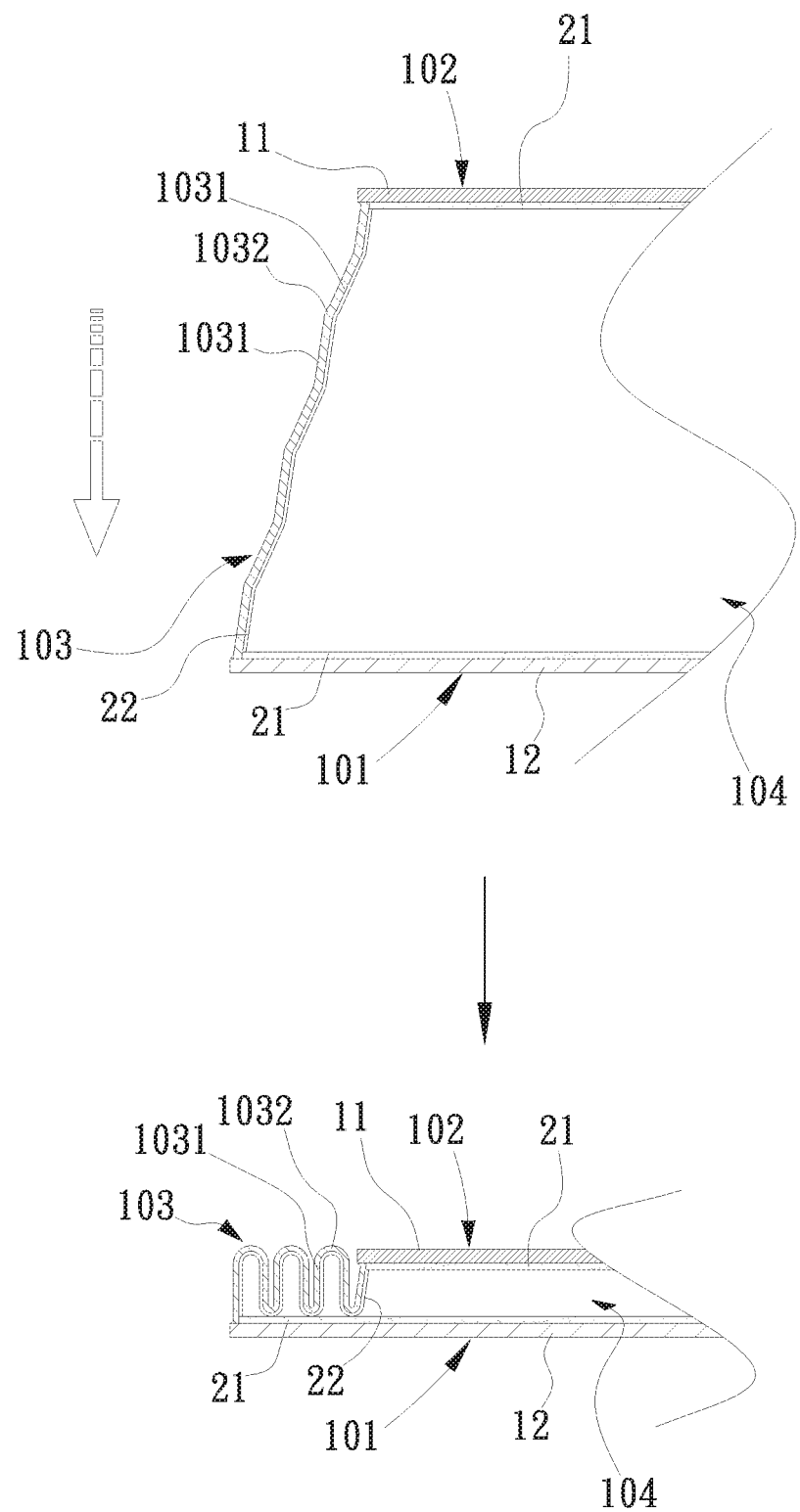
FIG. 1B shows the height-adjustable heat dissipation unit of FIG. 1A is compressed into a folded state having a reduced height.
Figure 1C:
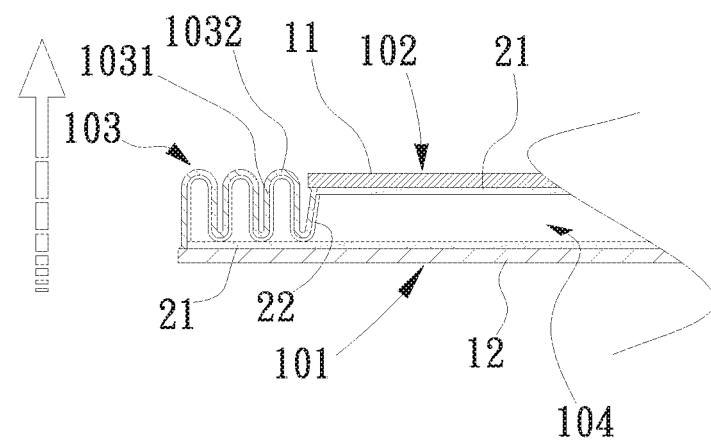
FIG. 1C shows the height-adjustable heat dissipation unit of FIG. 1B in the folded state is pulled into the extended state having an increased height.
Figure 1C:
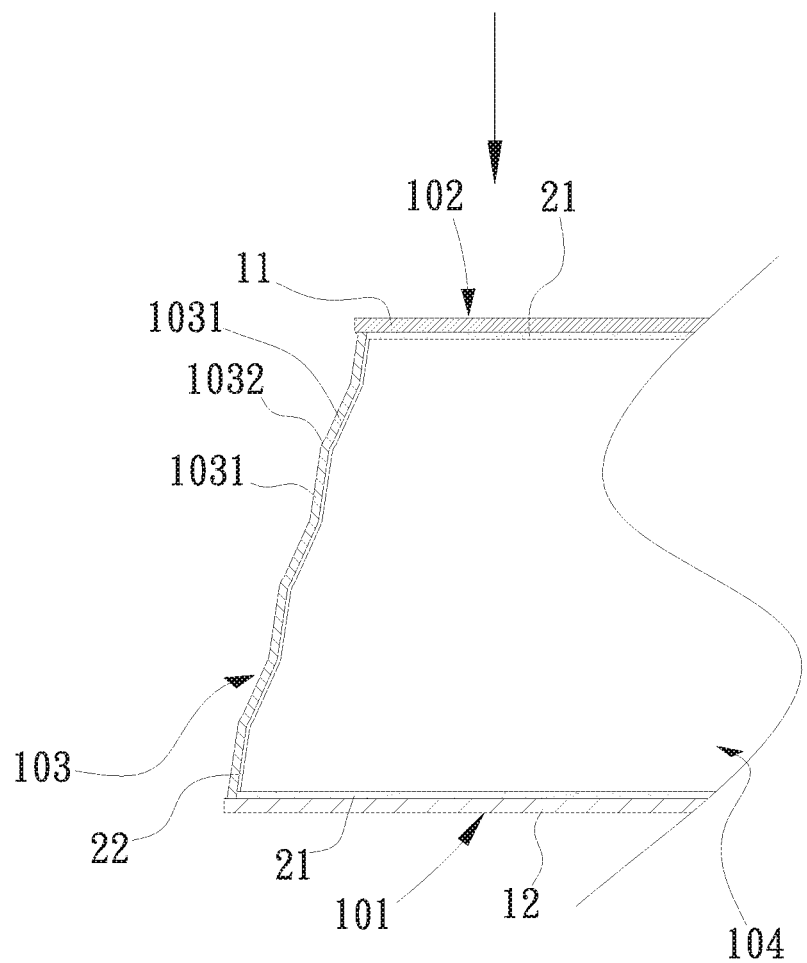

The extendable structure 103 consists of a plurality of folding sections 1031 and a connecting section 1032 formed between any two adjacent folding sections 1031. In the first embodiment, there are shown seven (7) folding sections 1031, which are sequentially referred to as the first, the second, the third, the fourth, the fifth, the sixth and the seventh folding section 1031 from bottom to top. Each of the folding sections 1031 is decreasing in diameter from bottom to top. That is, each of the folding sections 1031 has a diametrically wider lower opening 10311 and a diametrically narrower upper opening 10312. Each of the connecting sections 1032 is connected to between the wider lower opening 10311 of an upper folding section 1031 and the narrower upper opening 10312 of an adjacent lower folding section 1031. The uppermost folding section 1031, i.e. the seventh folding section 1031 in the first embodiment, is connected at its narrower upper opening 10312 to the peripheral edge of the inner surface of the top plate member 11, and the lowermost folding section 1031, i.e. the first folding section 1031 in the first embodiment, is connected at its wider lower opening 10311 to the peripheral edge of the inner surface of the bottom plate member 12. With the above arrangements of the folding sections 1031 and the connecting sections 1032, the extendable structure 103 can be compressed from an extended state into a folded state to have a reduced overall height or length, as shown in FIG. 1B; or be pulled from the folded state into the extended state again to have an increased overall height or length, as shown in FIG. 1C. It is noted that, in the present invention, the folding sections 1031 are not necessarily limited to seven in number. In practical implementation of the present invention, the number of the folding sections 1031 can be adjusted according to the overall height or length of the main body 10 that is actually needed by a user. For instance, the number of the folding sections 1031 can be less than 7 (e.g. 3) or more than 7 (e.g. 12).

The vaporizing section 101, the extendable structure 103 and the condensing section 102 together define the chamber 104 in between them. The chamber 104 is internally provided with a working fluid, which can be pure water, methanol or a coolant. The chamber 104 is also internally provided with a main body wick structure 21 and a coating layer 22. The coating layer 22 can be extended or compressed along with the folding sections 1031 when the extendable structure 103 is pulled or compressed. The main body wick structure 21 can be a sintered metal powder structure, a woven mesh structure, a fibrous structure, a grooved structure, or any combination thereof, and is provided on at least an inner wall surface of the chamber 104. In the first embodiment, the main body wick structure 21 is illustrated as a sintered metal powder structure provided in the chamber 104 on an inner wall surface of the vaporizing section 101 and of the condensing section 102, that is, on the inner surface of the bottom plate member 12 and of the top plate member 11. In the first embodiment, one extendable structure 103 located between the vaporizing section 101 and the condensing section 102 is illustrated. However, it is understood, in practical implementation of the present invention, two or more extendable structures 103 can be included and located between the bottom and the top plate member 12, 11 to provide changeful usages of the height-adjustable heat dissipation unit 1.

In the first embodiment, the coating layer 22 is illustrated as a wick structure, which can be, for example, a woven mesh structure, a fibrous structure, or a grooved structure. In practical implementation of the present invention, the coating layer 22 can be a woven mesh structure, a fibrous structure or a combination of a whisker with a woven mesh structure or a fibrous structure. The coating layer 22 is provided in the chamber 104 and located on inner wall surfaces of the extendable structure 103 to extend between the top and the bottom plate member 11, 12. More specifically, an end of the coating layer 22 is in contact with the main body wick structure 21 provided in the chamber 104 on the inner surface of the top plate member 11, and the other end of the coating layer 22 is in contact with the main body wick structure 21 provided in the chamber 104 on the inner surface of the bottom plate member 12.

Figure 2A:
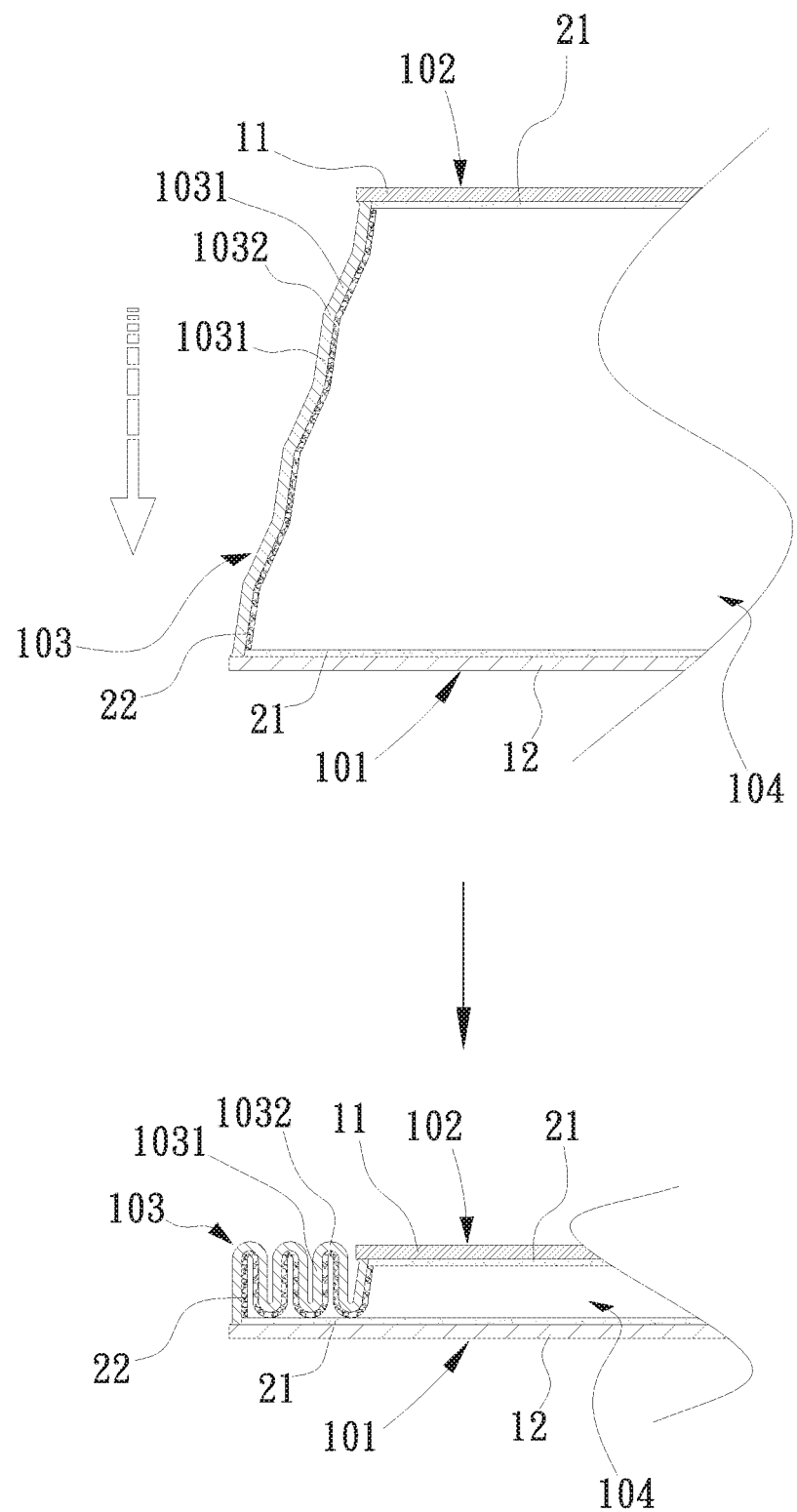
FIG. 2A shows a variant of the height-adjustable heat dissipation unit according to the first embodiment of the present invention in an extended state having an increased height is compressed into a folded state having a reduced height.
Figure 2B:
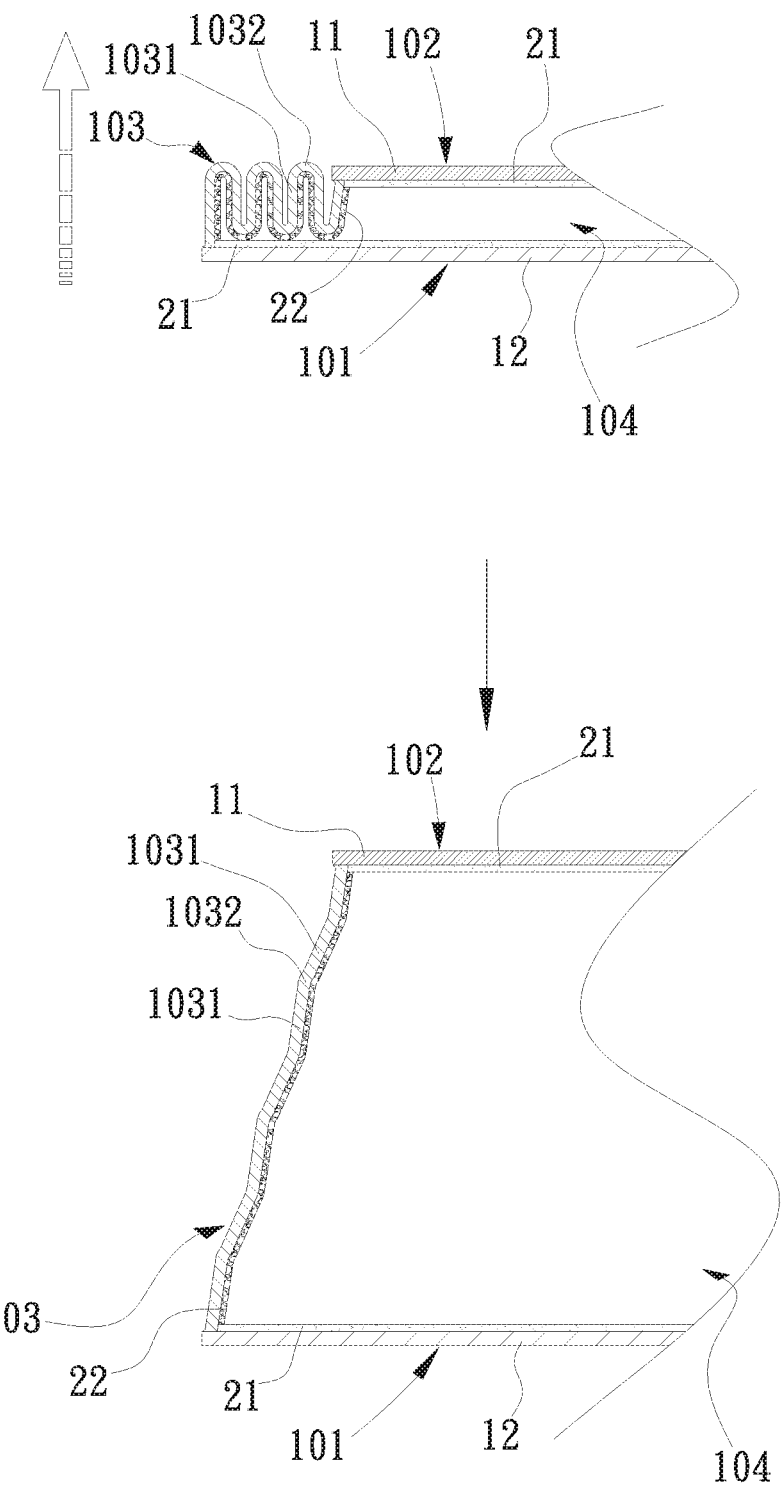
FIG. 2B shows the height-adjustable heat dissipation unit of FIG. 2A in the folded state is pulled into the extended state having an increased height.

In a variant of the first embodiment, as shown in FIGS. 2A and 2B, the coating layer 22 is not a wick structure but a structure formed of a soft and flexible polymeric material, such as polyester fibers or nylon fibers; a soft and flexible paper material, such as any type of fiber paper; a soft and flexible fabric material, such as a non-woven fabric or a cotton fabric; or a shape memory alloy, such as a titanium nickel alloy, a titanium palladium alloy or a titanium nickel copper alloy. The coating layer 22 is provided in the chamber 104 and located on inner wall surfaces of the extendable structure 103 to extend between and connect to the main body wick structure 21 provided in the chamber 104 on the inner surface of the top and the bottom plate member 11, 12. With the capillary action of the fibers on the coating layer 22, such as the capillary action of the non-woven fabric, the coating layer 22 absorbs the condensed working fluid in the main body wick structure 21 that is provided in the chamber 104 on the inner surface of the top plate member 11 and conveys the absorbed condensed working fluid to the main body wick structure 21 that is provided in the chamber 104 on the inner surface of the bottom plate member 12. With the coating layer 22, the extendable structure 103 can have effectively increased flexible extension, structural strength and toughness.

When the vaporizing section 101 of the main body 10 has been attached to a heat-producing element, such as a CPU, in an electronic device, such as a notebook computer, a personal computer, a communication chassis, a server, a smartphone, a communication apparatus, an industrial apparatus or a transporting device (not shown), the extendable structure 103 can be upward pulled from a folded state to an extended state, as shown in FIG. 1C, such that the connecting sections 1032 located between two adjacent folding sections 1031 are deformed and upward stretched, bringing the condensing section 102 of the main body 10 to a height at an area in the electronic device farther away from the heat source to facilitate quick removal of heat away from the heat source. Since the folding sections 1031 and the connecting sections 1032 of the extendable structure 103 are made of a soft and flexible material, they can be easily freely bent or curved to bypass any other electronic element that hinders the condensing section 102 from being upward extended to the area farther away from the heat source. On the other hand, when it is necessary to shorten the height of the extendable structure 103 for the condensing section 102 of the main body 10 to be located at an area spaced from but closer to the heat source, the extendable structure 103 can be downward compressed from the extended state to a partially or fully folded state, as shown in FIG. 1B, such that the connecting sections 1032 located between two adjacent folding sections 1031 are deformed, bringing, for example, the fifth to the second folding sections 1031 to sequentially collapse and move to positions circumferentially inside the first folding section 1031. At this point, the sequentially collapsed folding sections 1031 bring the extendable structure 103 to a shape similar to a cone or a disk having a plurality of concentric circles, and the condensing section 102 of the main body 10 is adjusted to a height closer to but spaced from the heat source. With the above arrangements, the heat dissipation unit 1 according to the first embodiment of the present invention is height-adjustable and flexibly bendable to effectively provide more changeful and convenient usages.

Further, when the same sized main body 10 is to be mounted in another differently sized electronic device, the extendable structure 103 of the main body 10 can also be flexibly adjusted and bent to change its overall height to adapt to electronic devices of different sizes. That is, the height-adjustable heat dissipation unit 1 of the present invention is universal to many electronic devices of different types and sizes and is therefore highly effective and convenient for use. Further, the extendable structure 103 of the main body 10 also enables the heat dissipation unit 1 to be packaged in a minimized height and accordingly, a smallest possible volume.

Figure 3:
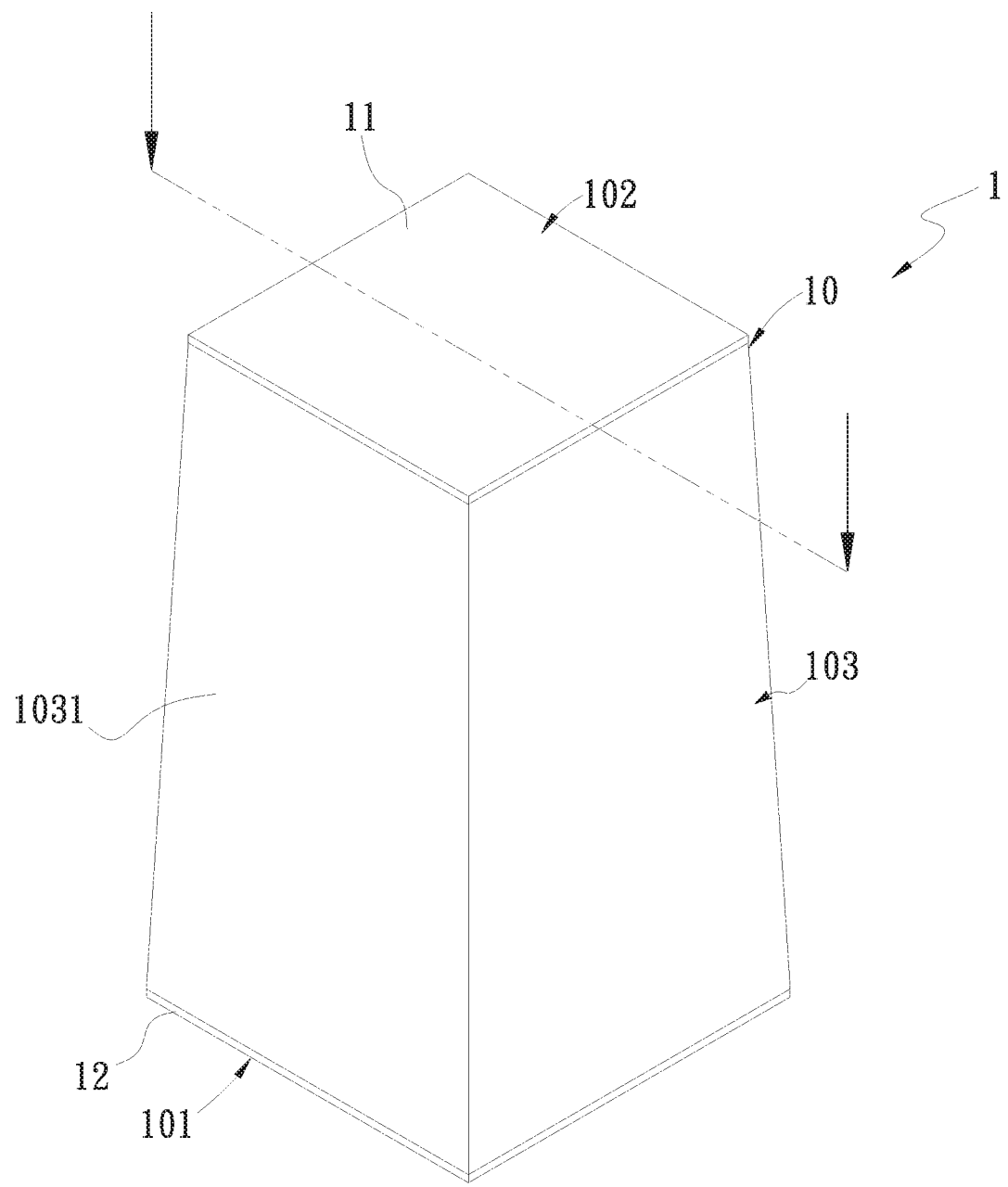
FIG. 3 is an assembled perspective view of a height-adjustable heat dissipation unit according to a second embodiment of the present invention.
Figure 3A:
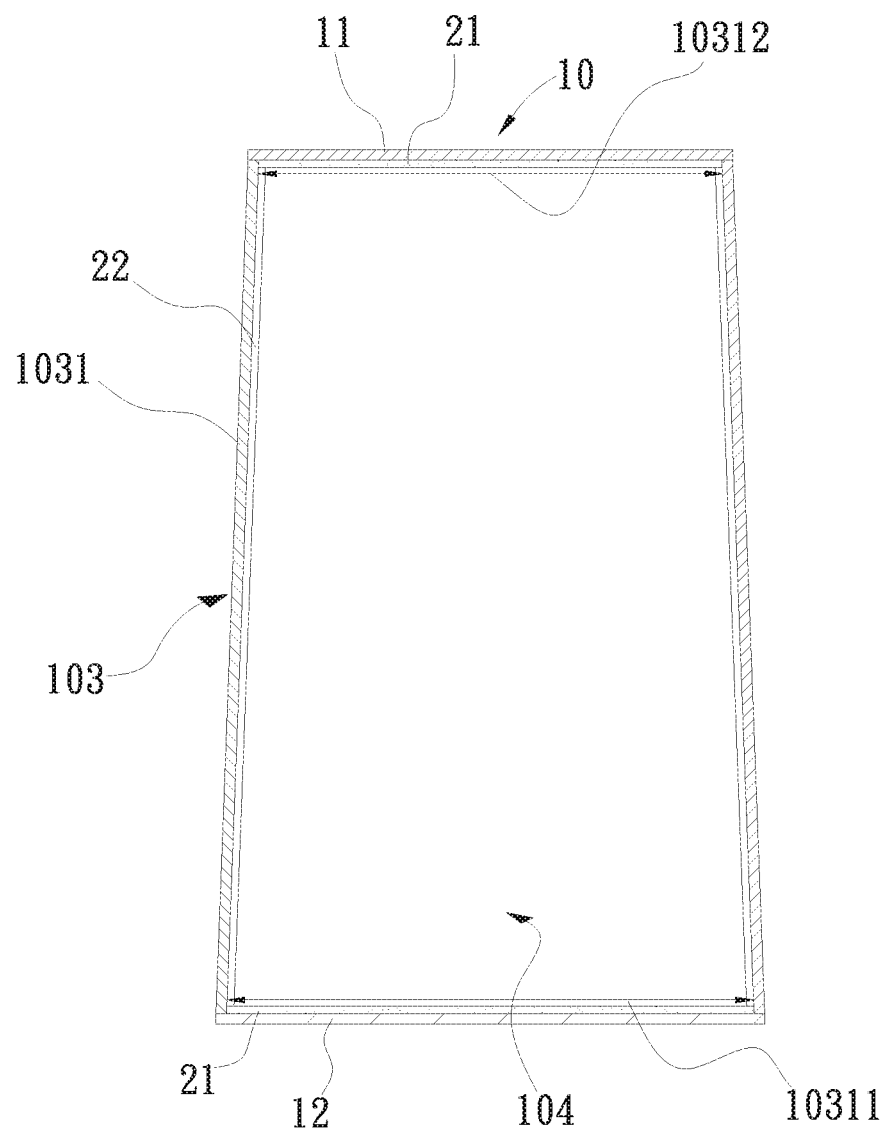
FIG. 3A is a sectional view showing the height-adjustable heat dissipation unit of FIG. 3 is in an extended state having an increased height.
Figure 3B:
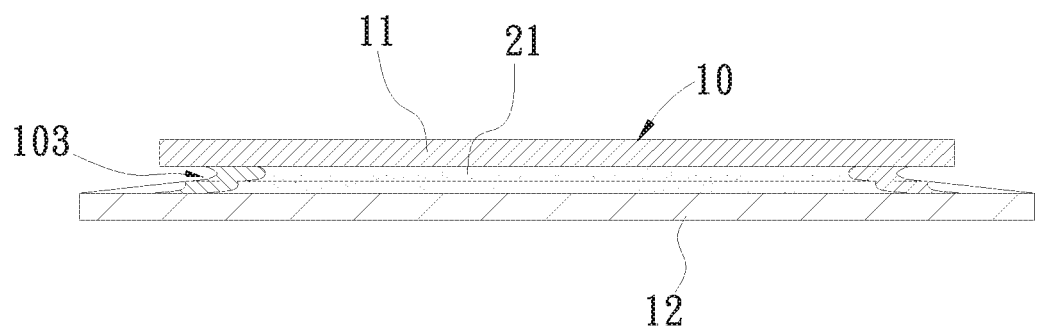
FIG. 3B is a sectional view showing the height-adjustable heat dissipation unit of FIG. 3A in the extended state is compressed into a folded state having a reduced height.
Figure 4:
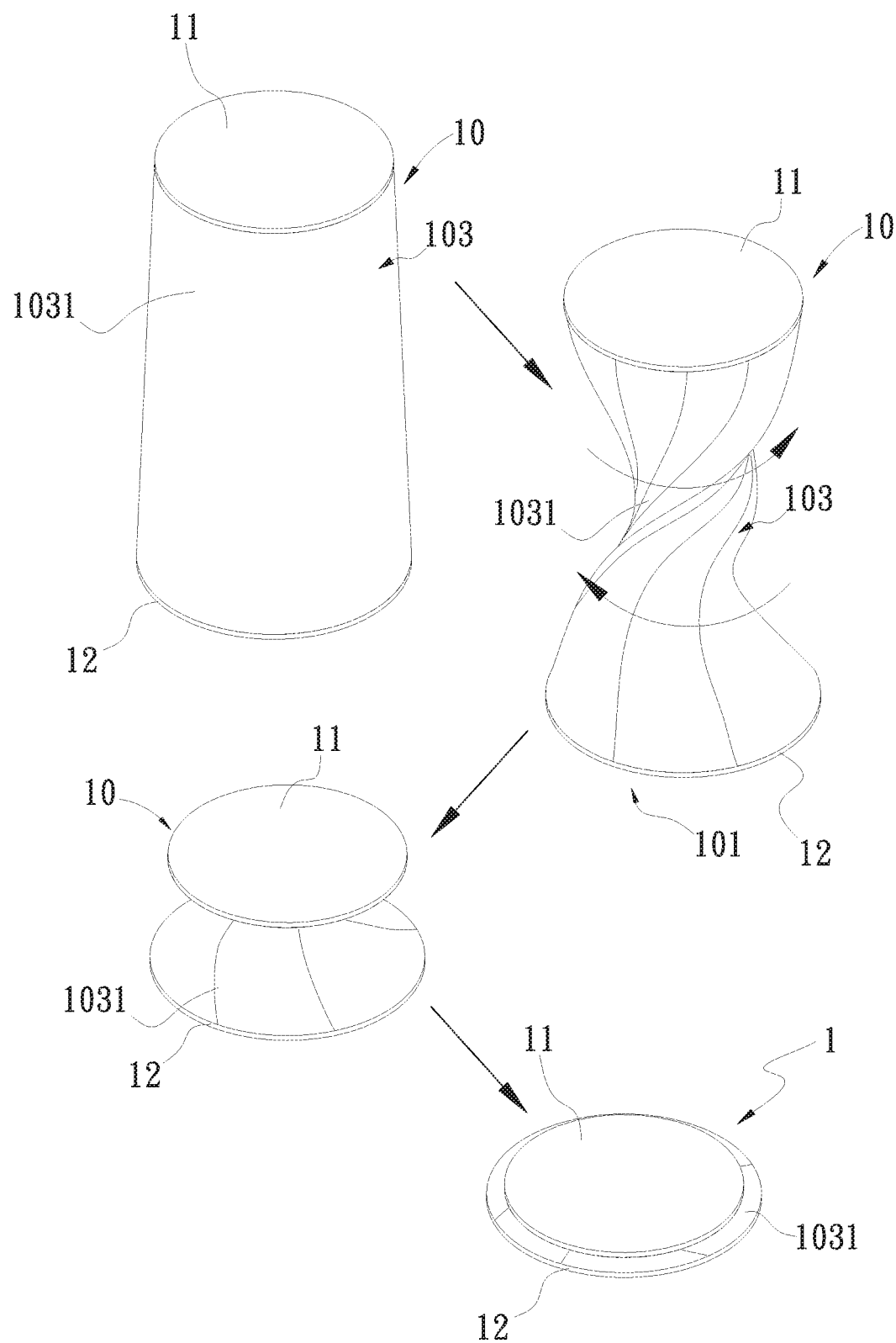
FIG. 4 shows the height-adjustable heat dissipation unit according to the second embodiment of the present invention can be twisted into a folded state having a reduced height or an extended state having an increased height.

Please refer to FIG. 3, which is an assembled perspective view of a height-adjustable heat dissipation unit 1 according to a second embodiment of the present invention; to FIGS. 3A and 3B, which are sectional views showing the height-adjustable heat dissipation unit 1 of FIG. 3 in an extended and a folded state, respectively; and to FIG. 4, which shows the height-adjustable heat dissipation unit 1 of the second embodiment can be twisted into the folded state or the extended state. The second embodiment is generally structurally and functionally similar to the first embodiment, except that it includes only one single folding section 1031 and is changeable to a folded state or an extended state by twisting the folding section 1031. More specifically, in the second embodiment, the height-adjustable heat dissipation unit 1 includes an upward tapered extendable structure 103, which consists of one single folding section 1031 connected to between a top plate member 11 and a bottom plate member 12. Therefore, the folding section 1031 is decreasing in diameter from bottom to top. Of course, the folding section 1031 can be otherwise increasing in diameter from bottom to top, depending on actual need in use.

As shown, in the second embodiment, the folding section 1031 has a diametrically wider lower opening 10311 and a diametrically narrower upper opening 10312. The folding section 1031 is connected at the narrower upper opening 10312 to the inner surface of the top plate member 11 and at the wider lower opening 10311 to the inner surface of the bottom plate member 12. When the folding section 1031 is subjected to a twisting force applied thereto to be axially compressed or extended, the coating layer 22 provided in the chamber 104 on the inner wall surface of the extendable structure 103 is twisted along with the folding section 1031 to be compressed or extended. More specifically, to extend a compressed and folded folding section 1031, simply apply two opposite twisting forces to the top plate member 11 and the bottom plate member 12 at the same time. For example, a counterclockwise twisting force is applied to the top plate member 11 while a clockwise twisting force is applied to the bottom plate member 12. At this point, the entire folding section 1031 subjected to the two opposite twisting forces can be pulled and extended to increase its height, as shown in FIG. 3A. On the other hand, to compress and fold the extended folding section 1031, simply apply two opposite twisting forces to the top plate member 11 and the bottom plate member 12 at the same time. For example, a clockwise twisting force is applied to the top plate member 11 while a counterclockwise twisting force is applied to the bottom plate member 12. At this point, the entire folding section 1031 subjected to the two opposite twisting forces can be compressed and folded to reduce its height, as shown in FIG. 3B. Therefore, in the second embodiment, with the twistable folding section 1031 of the extendable structure 103, the condensing section 102 of the main body 10 is freely adjustable to a different height from the vaporizing section 101 of the main body 10 and be located in an electronic device at an area that is farther away from a heat source in the electronic device or is closer to but still spaced from the heat source, so as to facilitate efficient removal of heat away from the heat source.

Further, in the second embodiment, the chamber 104, the main body wick structure 21 or the coating layer 22 can be additionally provided with a hydrophilic or a hydrophobic coating.

In all of the above-described embodiments, the height-adjustable heat dissipation unit 1 according to the present invention is well flexible and bendable to effectively change its overall height or length, making the height-adjustable heat dissipation unit 1 universal to electronic devices of different types and sizes to provide excellent convenience in use. Further, the overall volume of the height-adjustable heat dissipation unit 1 with the above design can be largely reduced to facilitate convenient and economical packaging, storing and transporting thereof.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A height-adjustable heat dissipation unit comprising a main body including a top plate member, a bottom plate member, and an extendable structure together defining a chamber in between them and wherein the extendable structure interconnects and tapers continuously between the top plate member and the bottom plate member, the extendable structure comprising a plurality of folding sections configured such that the extendable structure can be extended to an increased length and compressed to a decreased length to respectively increase or reduce a height of the main body where, when the extendable structure is compressed to a smallest height of the main body, the plurality of folding sections is in a nested configuration with alternating inward and outward bending of the plurality of folding sections; the chamber being internally provided with a main body wick structure and a working fluid; and the main body wick structure being provided on at least an inner wall surface of the chamber.

2. The height-adjustable heat dissipation unit as claimed in claim 1, wherein the chamber is further internally provided with a coating layer provided in the chamber, located on inner wall surfaces of the extendable structure, and extending between and connected to the main body wick structure provided in the chamber.

3. The height-adjustable heat dissipation unit as claimed in claim 1, wherein the main body further includes a vaporizing section located at the bottom plate member and a condensing section located at the top plate member.

4. The height-adjustable heat dissipation unit as claimed in claim 2, wherein the coating layer is a wick structure selected from the group consisting of a grooved structure, a woven mesh structure, and a fibrous structure.

5. The height-adjustable heat dissipation unit as claimed in claim 2, wherein the coating layer is made of a material selected from the group consisting of a polymeric material, a paper material, a fabric material, and a shape memory alloy.

6. The height-adjustable heat dissipation unit as claimed in claim 2, wherein the coating layer is provided in the chamber and located on inner wall surfaces of the extendable structure to extend between the top and the bottom plate member, such that an end of the coating layer is in contact with the main body wick structure provided in the chamber on an inner surface of the top plate member, and the other end of the coating layer is in contact with the main body wick structure provided in the chamber on an inner surface of the bottom plate member.

7. The height-adjustable heat dissipation unit as claimed in claim 1, wherein each of the folding sections is decreasing in diameter from bottom to top and accordingly has a diametrically wider lower opening and a diametrically narrower upper opening; and wherein the extendable structure further includes a connecting section formed between any two adjacent folding sections, each connecting section being connected to between the wider lower opening of an upper folding section and the narrower upper opening of an adjacent lower folding section.

8. The height-adjustable heat dissipation unit as claimed in claim 1, wherein the main body wick structure is selected from the group consisting of a sintered metal powder structure, a woven mesh structure, a fibrous structure, a grooved structure, and any combination thereof.

9. The height-adjustable heat dissipation unit as claimed in claim 1, wherein the main body is selected from the group consisting of a vapor chamber and a heat spreader.

10. The height-adjustable heat dissipation unit as claimed in claim 1, wherein the extendable structure is made of a material selected from the group consisting of an elastic material and a non-metal material.

11. The height-adjustable heat dissipation unit as claimed in claim 1, wherein the top and the bottom plate member are made of a metal material; and the metal material being selected from the group consisting of a copper material, a gold material, and an aluminum material.

* * * * *